(12) United States Patent
Lin

(10) Patent No.: US 11,405,005 B2
(45) Date of Patent: Aug. 2, 2022

(54) RADIO FREQUENCY AMPLIFIER CIRCUIT

(71) Applicant: RichWave Technology Corp., Taipei (TW)

(72) Inventor: Cheng-Min Lin, Taipei (TW)

(73) Assignee: RichWave Technology Corp., Taipei (TW)

( * ) Notice: Subject to any disclaimer, the term of this patent is extended or adjusted under 35 U.S.C. 154(b) by 117 days.

(21) Appl. No.: 16/992,116

(22) Filed: Aug. 13, 2020

(65) Prior Publication Data

US 2021/0050824 A1 Feb. 18, 2021

Related U.S. Application Data

(60) Provisional application No. 62/885,823, filed on Aug. 13, 2019.

(30) Foreign Application Priority Data

Jun. 29, 2020 (TW) .................................. 109121760

(51) Int. Cl.
*H03F 1/56* (2006.01)
*H03H 7/38* (2006.01)
(Continued)

(52) U.S. Cl.
CPC ............ *H03F 1/565* (2013.01); *H03F 3/195* (2013.01); *H03H 7/38* (2013.01); *H04B 1/0458* (2013.01);
(Continued)

(58) Field of Classification Search
CPC .... H03F 1/565; H03F 3/195; H03F 2200/387; H03F 2200/451; H03H 7/38; H04B 1/0458
(Continued)

(56) References Cited

U.S. PATENT DOCUMENTS 10,003,311 B1 * 6/2018 Canning ................. H01L 23/66
2008/0211586 A1 9/2008 Galan

FOREIGN PATENT DOCUMENTS

CN 107925386 4/2018
FR 2847745 A1 * 5/2004 ............ H03F 3/195
(Continued)

OTHER PUBLICATIONS

Li et al., "A Monolithic U-Band InP HBT Stacked Power Amplifier with On-Chip Active Biasing", Microwave Journal, Sep. 2018. (Year: 2018).*
(Continued)

*Primary Examiner* — Hafizur Rahman
(74) *Attorney, Agent, or Firm* — JCIPRNET

(57) ABSTRACT

A radio frequency amplifier circuit is provided. A matching circuit is configured on a radio frequency path of an input end or an output end of an amplifier. An inductance-capacitance resonance circuit and the matching circuit share an inductor included in the matching circuit to generate a corresponding resonance frequency. The matching circuit provides an input impedance or an output impedance matching two fundamental tones in a radio frequency signal at a first frequency and a second frequency. The inductance-capacitance resonance circuit provides a filtering path for filtering a signal component outside a frequency band formed by the first frequency and the second frequency in the radio frequency signal.

20 Claims, 12 Drawing Sheets

(51) Int. Cl.
*H03F 3/195* (2006.01)
*H04B 1/04* (2006.01)

(52) U.S. Cl.
CPC .. *H03F 2200/387* (2013.01); *H03F 2200/451* (2013.01)

(58) Field of Classification Search
USPC .......................................................... 330/295
See application file for complete search history.

(56) References Cited

FOREIGN PATENT DOCUMENTS

| | | |
|---|---|---|
| TW | 200534613 | 10/2005 |
| WO | 2019104325 | 5/2019 |

OTHER PUBLICATIONS

Series parallel conversion of R-L-C series and parallel resonators attached as an NPL by Analog/RF IntgCkts by radio Geek posted on Apr. 2015 (Year: 2015).*
"Office Action of Taiwan Counterpart Application", dated Dec. 17, 2020, p. 1-p. 6.

* cited by examiner

RADIO FREQUENCY AMPLIFIER CIRCUIT

CROSS-REFERENCE TO RELATED APPLICATION

This application claims the priority benefit of U.S. provisional application Ser. No. 62/885,823, filed on Aug. 13, 2019 and Taiwan application serial no. 109121760, filed on Jun. 29, 2020. The entirety of each of the above-mentioned patent applications is hereby incorporated by reference herein and made a part of this specification.

BACKGROUND

Technical Field

The invention relates to an amplifier circuit, and in particular, to a radio frequency amplifier circuit.

Description of Related Art

To suppress noise in a radio frequency amplifier circuit, a filter circuit is commonly adopted to filter the noise. However, it is difficult for such filter circuit to filter noise at a frequency close to a fundamental tone, for example, third-order intermodulation distortion (IM3) noise caused by non-linearity of an amplifier or a driving amplifier thereof. As a result, the linearity of the power output by the radio frequency amplifier is decreased.

SUMMARY

A radio frequency amplifier circuit according to an embodiment of the invention includes an amplifier, a first matching circuit, and a first inductance-capacitance resonance circuit. The amplifier includes an input end and an output end. The input end is configured to receive a first bias voltage. The first matching circuit is coupled to the input end or the output end of the amplifier. On a radio frequency path, the amplifier receives a radio frequency signal at the input end through the first matching circuit to amplify the radio frequency signal, or the amplifier transmits an amplified radio frequency signal at the output end through the first matching circuit. The first inductance-capacitance resonance circuit is coupled to the first matching circuit and connected to the radio frequency path. The first inductance-capacitance resonance circuit includes a first inductor. The first inductance-capacitance resonance circuit and the first matching circuit share an inductor included in the first matching circuit to obtain a first resonance frequency. A radio frequency signal includes two fundamental tones at a first frequency and a second frequency. The first matching circuit provides an input impedance or an output impedance matching the two fundamental tones. The first inductance-capacitance resonance circuit provides a first filtering path. The first filtering path filters a signal component outside a frequency band formed by the first frequency and the second frequency in the radio frequency signal.

DESCRIPTION OF THE EMBODIMENTS

Figure 1:
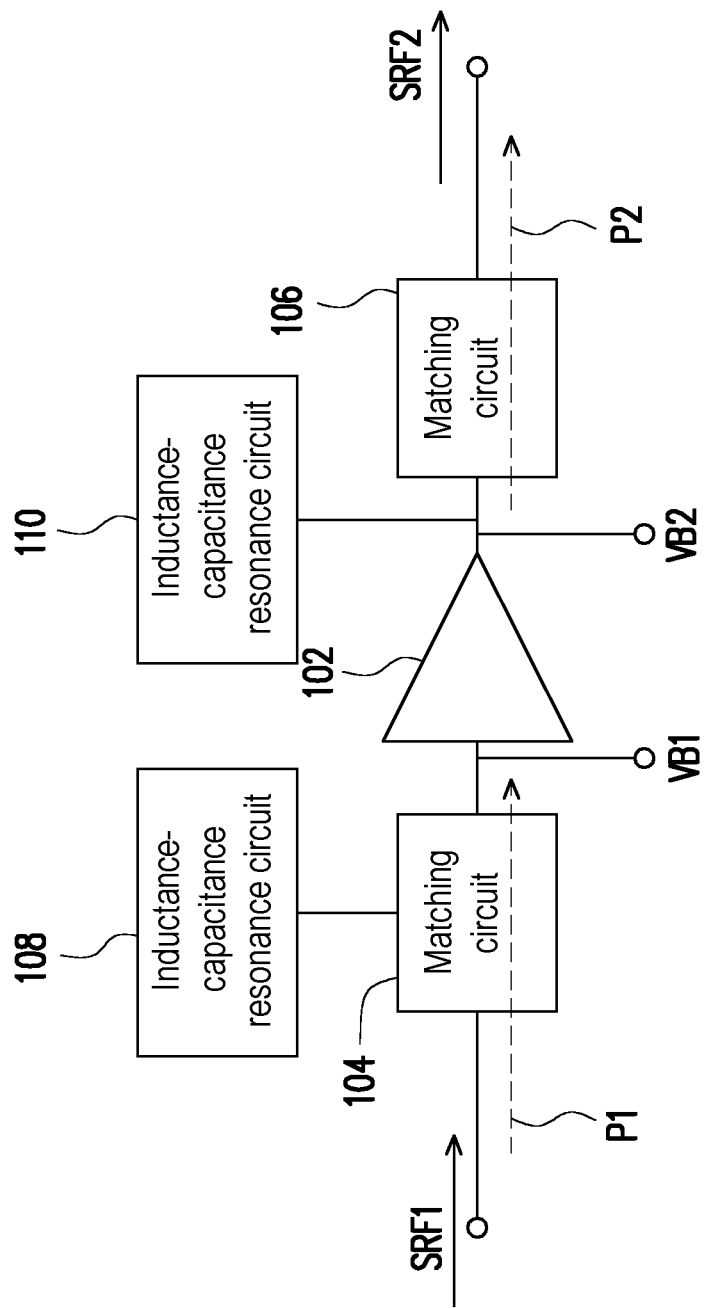
FIG. 1 to FIG. 12 are schematic views of a radio frequency amplifier circuit according to the embodiments of the invention.

FIG. 1 is a schematic view of a radio frequency amplifier circuit according to an embodiment of the invention. Referring to FIG. 1, the radio frequency amplifier circuit includes an amplifier 102, matching circuits 104 and 106, and inductance-capacitance resonance circuits 108 and 110. The matching circuit 104 is coupled to an input end of the amplifier 102 and the resonant circuit 108, and the matching circuit 106 is coupled to an output end of the amplifier 102 and the resonant circuit 110.

In the present embodiment, a radio frequency path may include a radio frequency input path P1, the amplifier 102, and a radio frequency output path P2. The amplifier 102 may receive a radio frequency signal SRF1 through the matching circuit 104 configured on the radio frequency input path P1. The radio frequency signal SRF1 may include two fundamental tones at a first frequency and a second frequency. The matching circuit 104 may provide an input impedance matching the two fundamental tones, that is, an input impedance matching the amplifier 102. The input end and the output end of the amplifier 102 may receive bias voltages VB1 and VB2 respectively. The bias voltages VB1 and VB2 may enable the amplifier 102 to work in a linearity region to amplify the radio frequency signal SRF1. The inductance-capacitance resonance circuit 108 is coupled to the matching circuit 104 and connected to the radio frequency input path P1. The inductance-capacitance resonance circuit 108 and the matching circuit 104 may share an inductor included in the matching circuit 104 to generate a corresponding resonance frequency.

The inductance-capacitance resonance circuit 108 may provide a filtering path for filtering signal components outside a frequency band formed by the first frequency and the second frequency in the radio frequency signal SRF1, for example, filter a frequency related to a difference between the first frequency and the second frequency. Further, the filtering path provided by the inductance-capacitance resonance circuit 108 is a low-impedance path for a signal at a frequency related to the difference between the first frequency and the second frequency, and a high-impedance path for a signal in the frequency band formed by the first frequency and the second frequency. Therefore, the signal at the frequency related to the difference between the first frequency and the second frequency may be guided to the filtering path provided by the inductance-capacitance resonance circuit 108 to be filtered.

Similarly, a filtering path provided by the inductance-capacitance resonance circuit 110 may also filter signal components outside the frequency band formed by the first frequency and the second frequency in an amplified radio frequency signal SRF2. That is, the inductance-capacitance resonance circuit 110 may be connected to the radio frequency output path P2, and the filtering path provided by the inductance-capacitance resonance circuit 110 is a low-impedance path for a signal at a frequency related to the difference between the first frequency and the second frequency, and a high-impedance path for a signal in the frequency band formed by the first frequency and the second frequency. In addition, the above bias voltage VB2 may be provided by the inductance-capacitance resonance circuit 110. The matching circuit 106 may provide an output impedance matching the two fundamental tones at the first frequency and the second frequency, that is, an output impedance matching the amplifier 102. On the radio frequency output path P2, the amplifier 102 transmits the amplified radio frequency signal SRF2 at the output end through the matching circuit 106.

In this way, the inductance-capacitance resonance circuits 108 and 110 provides the filtering paths to filter signal components outside the frequency band formed by the first frequency and the second frequency in the radio frequency signal SRF1, so that the noise related to the two fundamental tones of the radio frequency signal can be effectively suppressed, and the linearity of the power output by the radio frequency amplifier can be improved. In addition, the inductor included in the inductance-capacitance resonance circuit 108 and the inductor included in the matching circuit 104 are shared, so that the circuit size of the radio frequency amplifier can be effectively reduced.

Figure 2:
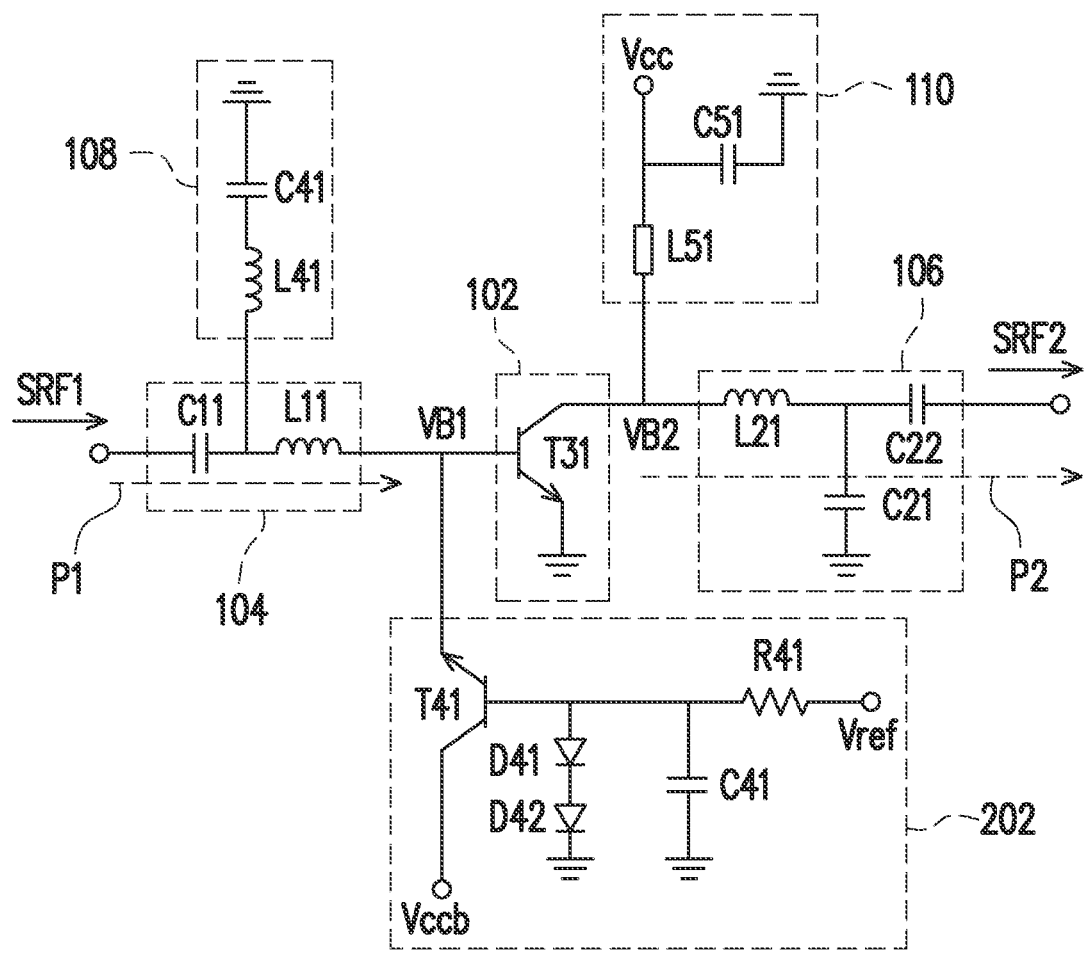

FIG. 2 is a schematic view of a radio frequency amplifier circuit according to another embodiment of the invention. Referring to FIG. 2, in the present embodiment, the radio frequency amplifier circuit may further include a bias circuit 202. The bias circuit 202 may provide a bias voltage VB1. The bias circuit 202 may include a transistor T41, a resistor R41, a diode circuit (D41, D42), and a capacitor C41. The transistor T41 is, for example, a BJT transistor, which may be an NPN transistor in the present embodiment. A second end (for example, an emitter) of the transistor T41 is coupled to the input end of the amplifier 102. A first end (for example, a collector) of the transistor T41 is coupled to a power voltage Vccb. The resistor R41 is coupled between a control end (for example, a base) of the transistor T41 and a reference bias end Vref. The diode circuit is coupled between the control end and a reference voltage end (for example but not limited to, a common voltage end or a grounding end) of the NPN transistor T41, and may include the diode D41 or D42 or the diodes D41 and D42 connected in series. The capacitor C41 is coupled between the control end of the transistor T41 and the reference voltage end. The transistor T41 may provide the bias voltage VB1 at the second end. The capacitor C41 and the diode circuit may help the transistor T41 to provide a stable bias voltage VB1.

In the present embodiment, the matching circuit 104 includes a capacitor C11 and an inductor L11. One end of the capacitor C11 is configured to receive the radio frequency signal SRF1, the other end of the capacitor C11 is coupled to one end of the inductor L11, and the other end of the inductor L11 is coupled to the amplifier 102. The inductance-capacitance resonance circuit 108 connected to the radio frequency input path P1 includes a capacitor C41 and an inductor L41. The inductor L41 is coupled between the capacitor C41 and a common node between the capacitor C11 and the inductor L11. The capacitor C41 is coupled between the inductor L41 and the reference voltage end. The capacitor C11 and inductor L11 may form the radio frequency input path P1 and enable the matching circuit 104 to provide the input impedance matching the amplifier 102. The input impedance provided by the matching circuit 104 may be determined by the capacitors C11 and C41 and the inductors L11 and L41. As the capacitor C41 and the inductor L41 of the inductance-capacitance resonance circuit 108 are shared, a capacitance value required by the capacitor C11 and an inductance value required by the inductor L11 may be smaller, which helps to reduce a size of the radio frequency amplifier circuit.

The amplifier 102 may be implemented by a transistor T31, for example, a BJT transistor. In the present embodiment, the transistor T31 may be, but is not limited to, an NPN transistor. For example, in other embodiments, the amplifier 102 may alternatively be implemented by a MOS transistor, a HEMT (High Electron Mobility Transistor) or other transistors. A control end (for example, a base) of the transistor T31 is coupled to the inductor L11. A second end (for example, an emitter) of the transistor T31 is coupled to the reference voltage end. A first end (for example, a collector) of the transistor T31 is coupled to the matching circuit 106 and the resonant circuit 110. The inductance-capacitance resonance circuit 108 and the matching circuit 104 may share the inductor L11. A resonance frequency of the inductance-capacitance resonance circuit 108 may be determined by the capacitor C41 and the inductors L11 and L41. Therefore, an inductor value required by the inductor L41 is reduced, which helps to reduce the size of the radio frequency amplifier circuit. The inductance-capacitance resonance circuit 108 may provide a low-impedance path at a frequency related to the difference between the first frequency and the second frequency, and provide a high impedance (which is much greater than the input impedance of the amplifier 102) at the first frequency and the second frequency, to effectively filter a signal at the frequency related to the difference between the first frequency and the second frequency. It should be noted that in some embodiments, positions of the capacitor C41 and the inductor L41 are interchangeable, not limited to the coupling method in FIG. 2. It should be noted that in some embodiments, the capacitor C41 may be a variable capacitor, so that a capacitance value of the capacitor C41 may be adjusted according to a working condition (for example, an operating bandwidth or an operating frequency) of the radio frequency amplifier circuit to adjust the impedance.

In the present embodiment, the matching circuit 106 includes an inductor L21 and capacitors C21 and C22. The inductance-capacitance resonance circuit 110 includes an inductor L51 and a capacitor C51. One end of the inductor L21 is coupled to the first end of the transistor T31, and the other end of the inductor L21 is coupled to the capacitor C22. The capacitor C22 is coupled between the inductor L21 and an output end of the matching circuit 106. The capacitor C21 is coupled between the reference voltage end and a common node between the inductor L21 and the capacitor C22. The inductor L51 is coupled between the first end of the transistor T31 and a power voltage end Vcc, and provides the bias voltage VB2 at the first end of the transistor T31. The capacitor C51 is coupled between the power voltage end Vcc and the reference voltage end. The inductor L21 and the capacitor C22 form the radio frequency output path P2. The inductor L21 and the capacitor C21 are configured to provide the impedance matching the output impedance of the amplifier 102. The inductor L51 may be implemented by, for example, a choke, which may be, for example, a transmission line with a ¼ wavelength of the radio frequency signal SRF1, a bonding wire, a SMD component, a trace of a PCB, or a spiral inductor. The inductor L51 and the capacitor C51 may provide a low-impedance path at a frequency related to the difference between the first frequency and the second frequency, and provide a high impedance (which is much greater than the output impedance of the amplifier 102) at the first frequency and the second frequency, to effectively filter a signal at the frequency related to the difference between the first frequency and the second frequency.

Figure 3:
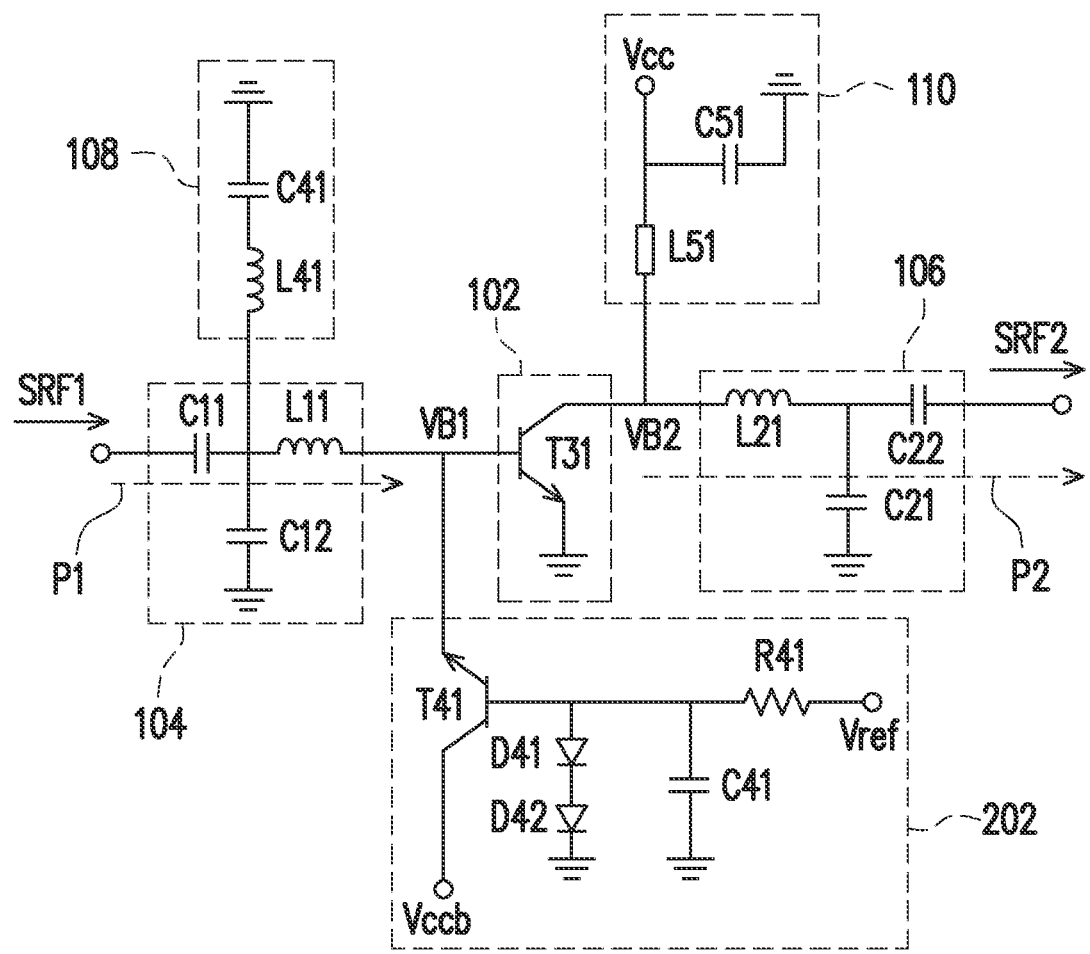

In addition, an implementation of the matching circuit 104 is not limited to the embodiment in FIG. 2. For example, in an embodiment in FIG. 3, the matching circuit 104 may further include a capacitor C12, coupled between the reference voltage end and the common node between the capacitor C11 and the inductor L11. In addition, in some embodiments, the capacitor C41 may also be a variable capacitor.

Figure 4:
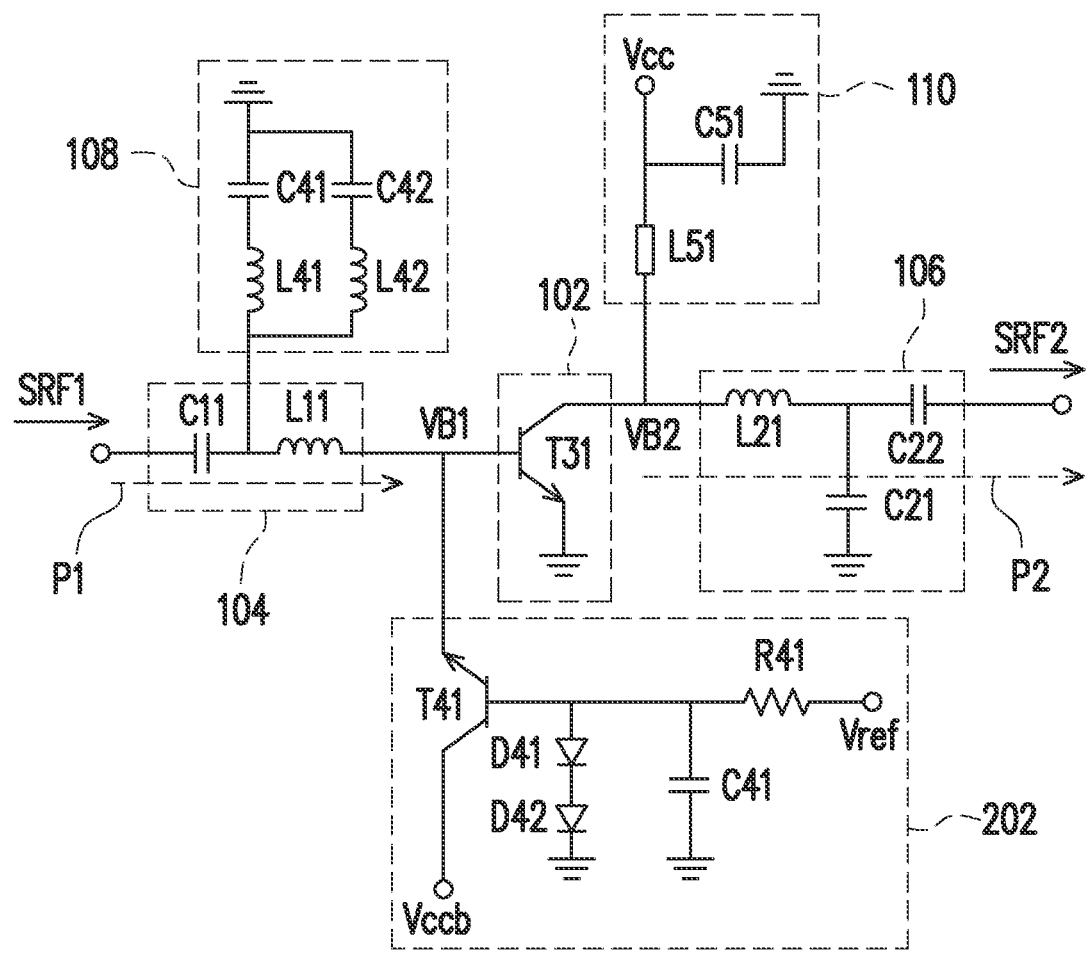

FIG. 4 is a schematic view of a radio frequency amplifier circuit according to another embodiment of the invention. Referring to FIG. 4, different from the embodiment in FIG. 2, the inductance-capacitance resonance circuit 108 in the present embodiment may further include a capacitor C42 and an inductor L42. The capacitor C42 and the inductor L42 are connected in series between the reference voltage end and the common node between the capacitor C11 and the inductor L11. The capacitor C42 and the inductor L42 may provide another low-impedance path, to increase an operating bandwidth of the inductance-capacitance resonance circuit 108, so that the inductance-capacitance resonance circuit 108 can more effectively filter a signal at a frequency fR related to the difference between the first frequency and the second frequency. For example, the capacitor C41 and the inductor L41 may provide a low-impedance path at a frequency fR+X, and the capacitor C42 and the inductor L42 may provide another low-impedance path at a frequency fR−X.

Figure 5:
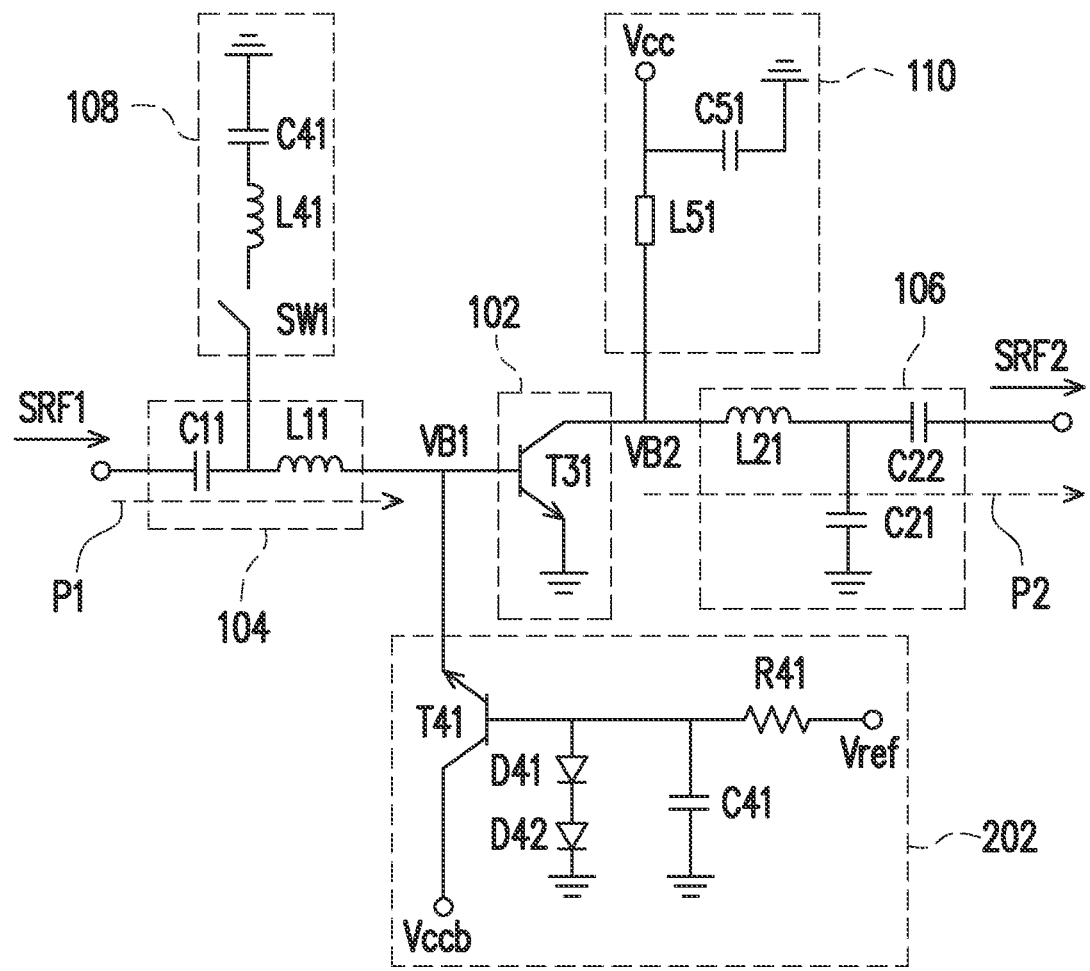

FIG. 5 is a schematic view of a radio frequency amplifier circuit according to another embodiment of the invention. Referring to FIG. 5, different from the embodiment in FIG. 2, the inductance-capacitance resonance circuit 108 in the present embodiment includes a switch SW1. The switch SW1 is coupled between the inductor L41 and a common node between the capacitor C11 and the inductor L11. When power of the radio frequency signal SRF1 is lower than a preset value, the switch SW1 may be controlled by a control circuit and enter an opened state to reduce a loss of the radio frequency signal SRF1. Only when the power of the radio frequency signal SRF1 is higher than or equal to the preset value, the switch SW1 is controlled by the control circuit to enter a closed state to perform filtering processing.

Figure 6:
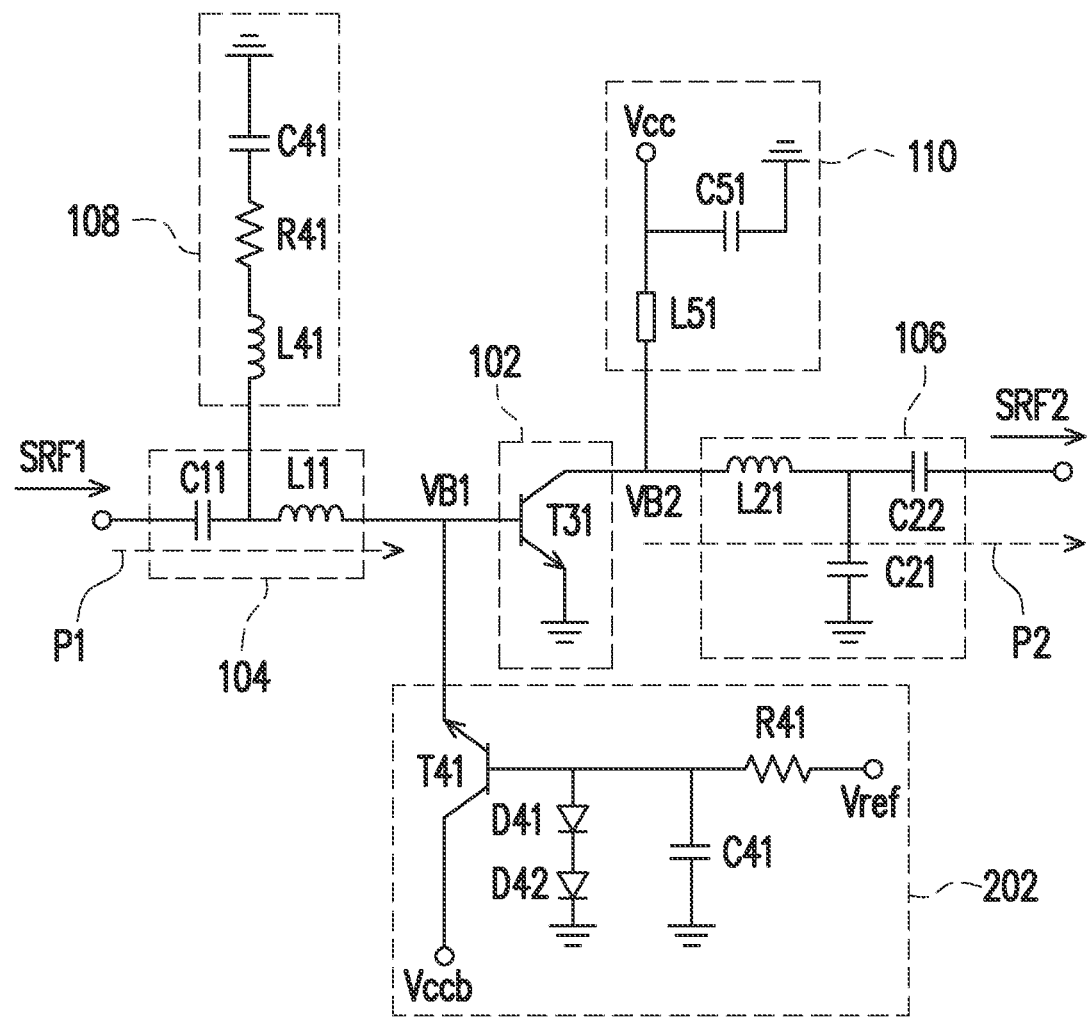

FIG. 6 is a schematic view of a radio frequency amplifier circuit according to another embodiment of the invention. Referring to FIG. 6, different from the embodiment in FIG. 2, the inductance-capacitance resonance circuit 108 in the present embodiment further includes a resistor R41. The resistor R41 is coupled between the capacitor C41 and the inductor L41, which can increase an operating bandwidth of the inductance-capacitance resonance circuit 108, so that the inductance-capacitance resonance circuit 108 can more effectively filter a signal at a frequency related to the difference between the first frequency and the second frequency.

Figure 7:
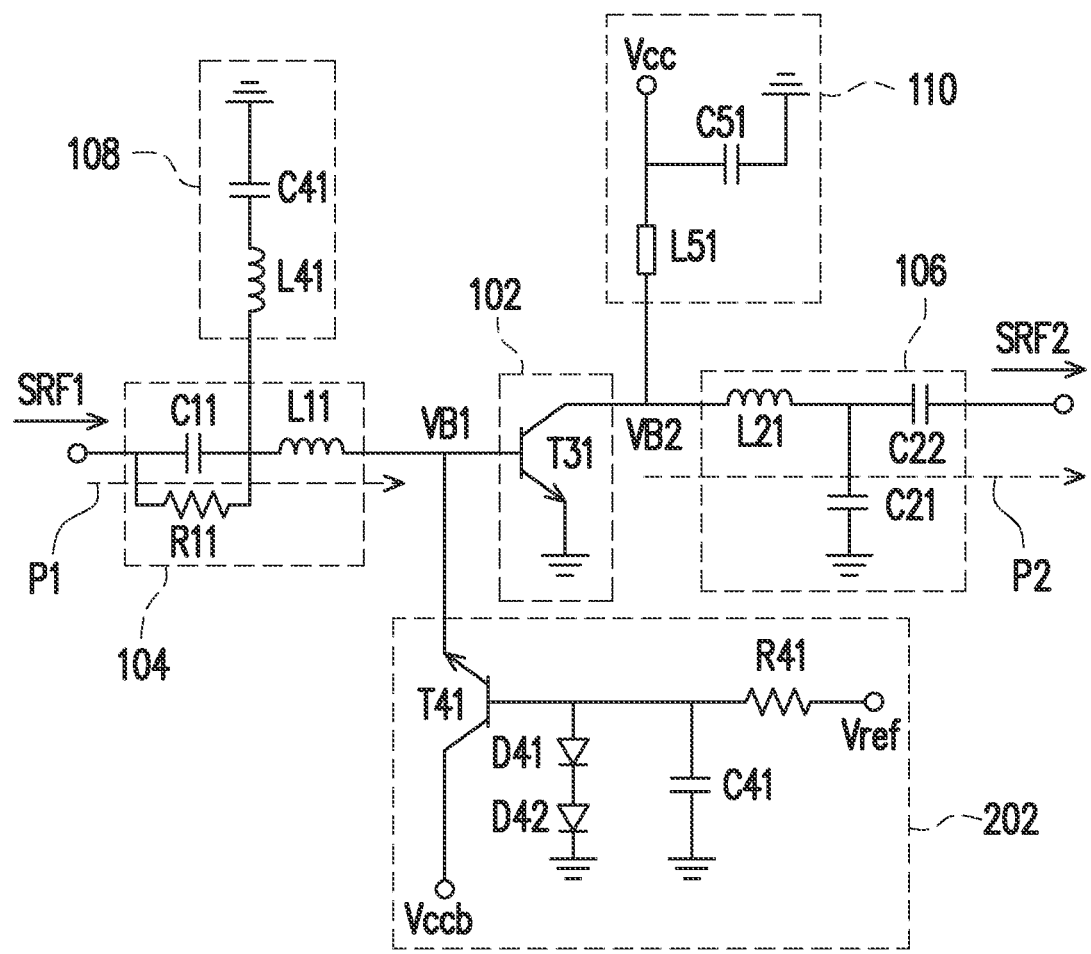

FIG. 7 is a schematic view of a radio frequency amplifier circuit according to another embodiment of the invention. Referring to FIG. 7, different from the embodiment in FIG. 2, the matching circuit 104 in the present embodiment further includes a resistor R11. The resistor R11 is connected in parallel to the capacitor C11, so that stability of the radio frequency amplifier circuit can be effectively improved. In some embodiments, the capacitor C41 may be a variable capacitor.

Figure 8:
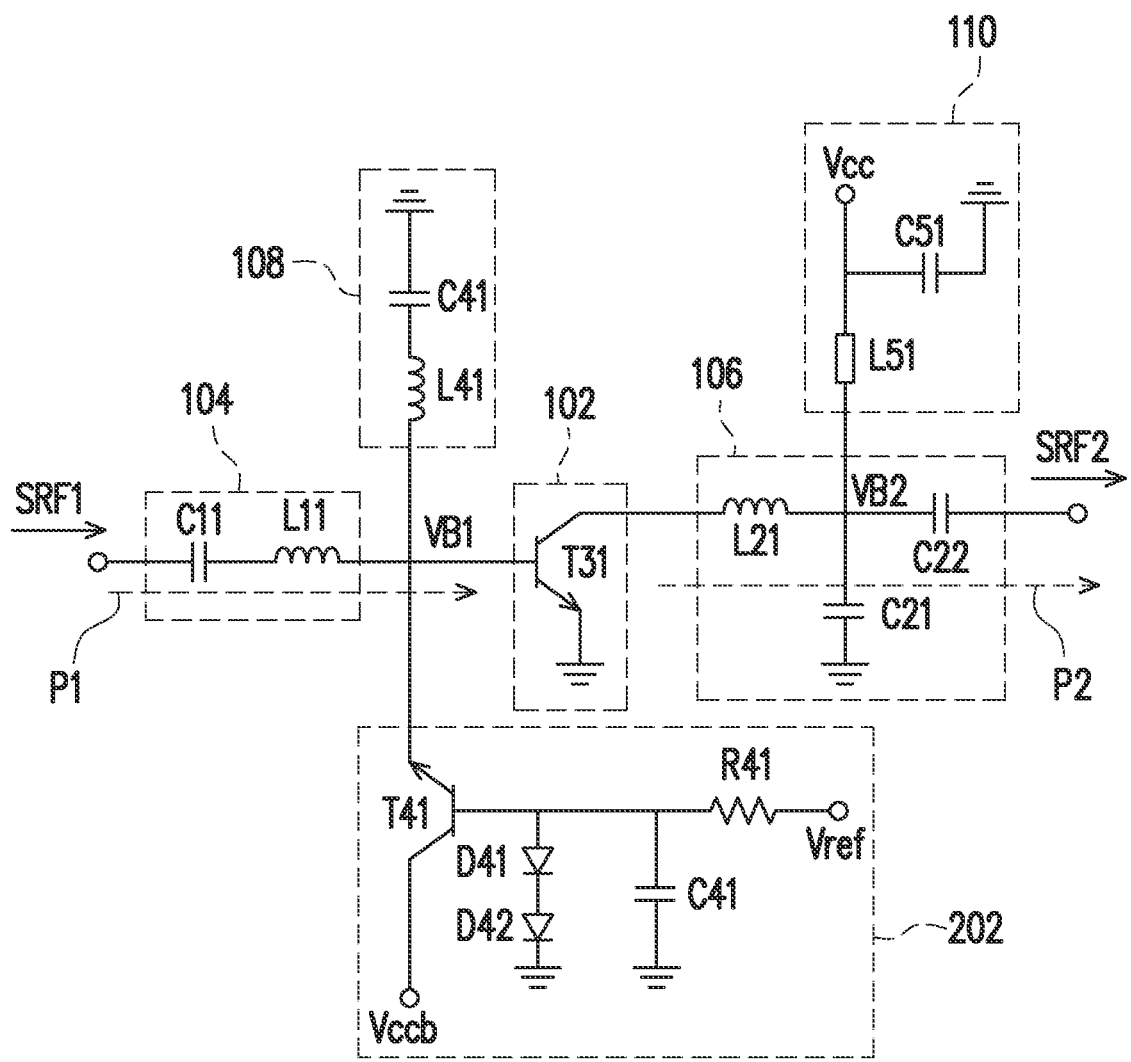
Figure 9:
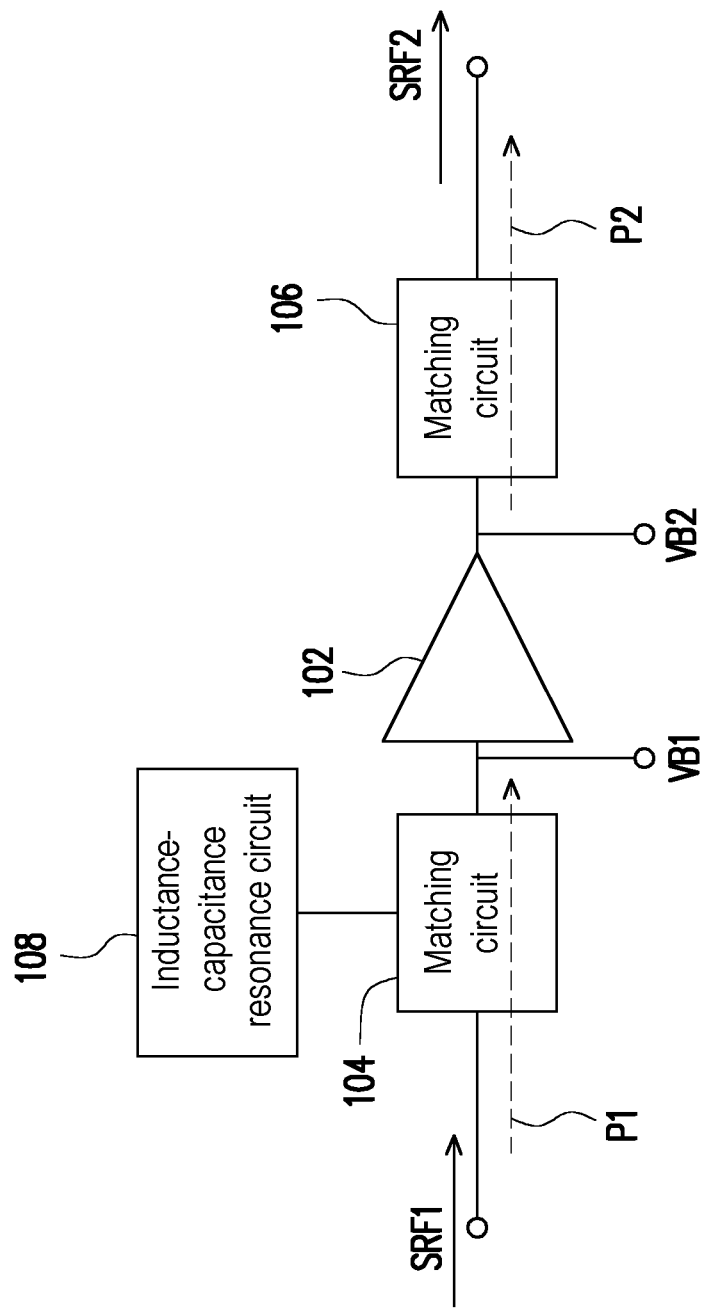
Figure 10:
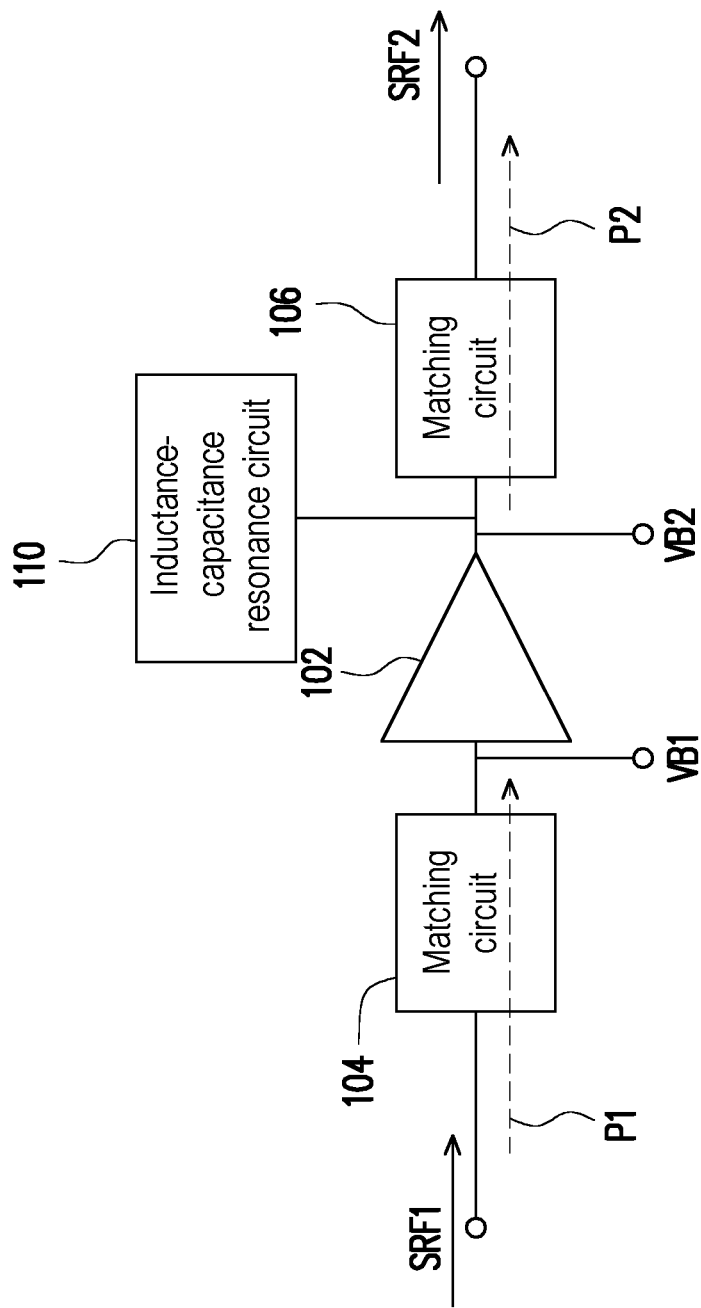
Figure 11:
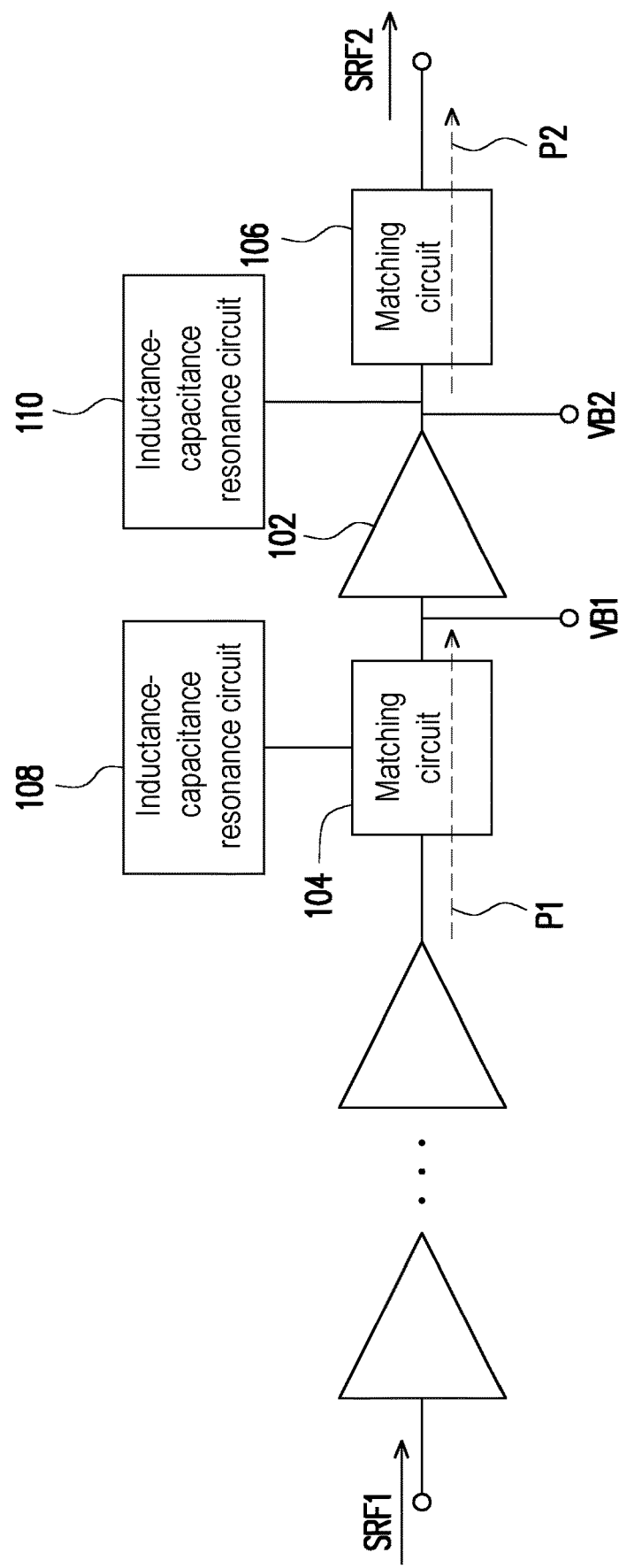
Figure 12:
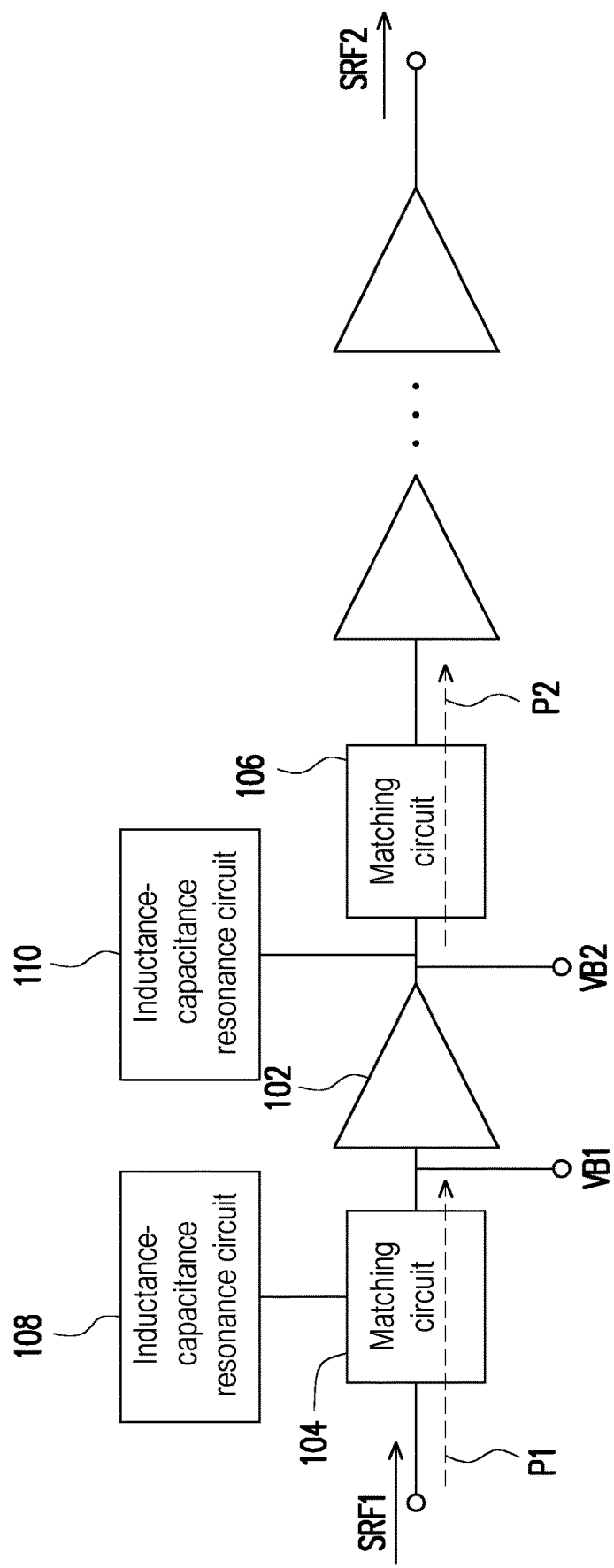

FIG. 8 is a schematic view of a radio frequency amplifier circuit according to another embodiment of the invention. Referring to FIG. 8, different from the embodiment in FIG. 2, the inductance-capacitance resonance circuit 108 in the present embodiment may be coupled to the input end of the amplifier 102, and the inductance-capacitance resonance circuit 110 may be coupled to the common node between the inductor L21 and the capacitor C22. In this way, a resonance frequency of the inductance-capacitance resonance circuit 110 may be determined by the inductor L51, the capacitor C51, and the inductor L21 of the matching circuit 106. The output impedance provided by the matching circuit 106 may be determined by the inductors L21 and L51 and the capacitors C21, C22, and C51. As the inductors and the capacitors of the matching circuit 106 and the inductance-capacitance resonance circuit 110 are shared, a size of the radio frequency amplifier circuit can be effectively reduced. In addition, details of an implementation in which the matching circuits 104 and 106 may provide an input impedance and an output impedance matching the amplifier 102, and the inductance-capacitance resonance circuits 108 and 110 may filter a signal at a frequency related to the difference between the first frequency and the second frequency are similar to those in the above embodiments. Therefore, the descriptions thereof are omitted herein.

It should be noted that in some embodiments, the radio frequency amplifier circuit may include only one inductance-capacitance resonance circuit. For example, in an embodiment in FIG. 9, the radio frequency amplifier circuit may omit the inductance-capacitance resonance circuit 110, and in an embodiment in FIG. 10, the radio frequency amplifier circuit may omit the inductance-capacitance resonance circuit 108. In addition, when the radio frequency amplifier circuit including a plurality of stages of amplifiers connected in series, the amplifier 102 in the above embodiments may be a first-stage amplifier or a last-stage amplifier of the plurality of stages of amplifiers. For example, in an embodiment in FIG. 11, the amplifier 102 is the last-stage amplifier of the plurality of stages of amplifiers, and in an embodiment in FIG. 12, the amplifier 102 is the first-stage amplifier of the plurality of stages of amplifiers. Since implementations of the matching circuits 104 and 106 and the inductance-capacitance resonance circuits 108 and 110 in FIG. 9 to FIG. 12 are similar to those of the matching circuits 104 and 106 and the inductance-capacitance resonance circuits 108 and 110 in the above embodiments, a person of ordinary skill in the art may derive implementation details from the above embodiments. Therefore, the descriptions thereof are omitted herein.

Based on the above, in the embodiments of the invention, the matching circuit may be configured on the radio frequency path of the input end or the output end of the amplifier. The inductance-capacitance resonance circuit and the matching circuit may share the inductor included in the matching circuit to generate the corresponding resonance frequency. The matching circuit may provide the input impedance or the output impedance matching the two fundamental tones in the radio frequency signal at the first frequency and the second frequency. The inductance-capacitance resonance circuit may provide the filtering path for filtering signal components outside the frequency band formed by the first frequency and the second frequency in the radio frequency signal. In this way, the noise related to the two fundamental tones of the radio frequency signal can be effectively suppressed, the linearity of the power output by the radio frequency amplifier can be increased, and the circuit size of the radio frequency amplifier can be reduced.

What is claimed is:

1. A radio frequency amplifier circuit, comprising:
an amplifier, comprising an input end configured to receive a first bias voltage, and an output end;
a first matching circuit, coupled to the input end or the output end of the amplifier, wherein on a radio frequency path, the amplifier receives a radio frequency signal at the input end through the first matching circuit to amplify the radio frequency signal, or the amplifier transmits an amplified radio frequency signal at the output end through the first matching circuit; and
a first inductance-capacitance resonance circuit, coupled to the first matching circuit and connected to the radio frequency path, wherein the first inductance-capacitance resonance circuit comprises a first inductor, and the first inductance-capacitance resonance circuit and the first matching circuit share an inductor comprised in the first matching circuit to obtain a first resonance frequency, wherein the radio frequency signal comprises two fundamental tones at a first frequency and a second frequency, the first matching circuit provides an input impedance or an output impedance matching the two fundamental tones, the first inductance-capacitance resonance circuit provides a first filtering path, and the first filtering path filters a signal component outside a frequency band formed by the first frequency and the second frequency in the radio frequency signal, wherein the first matching circuit is coupled to the input end of the amplifier, and the inductor shared by the first inductance-capacitance resonance circuit is also coupled to the input end of the amplifier, or wherein the first matching circuit is coupled to the output end of the amplifier, and the inductor shared by the first inductance-capacitance resonance circuit is also coupled to the output end of the amplifier.

2. The radio frequency amplifier circuit according to claim 1, wherein the first matching circuit is coupled to the input end of the amplifier, and configured to provide the input impedance matching the two fundamental tones, and on the radio frequency path, the amplifier receives the radio frequency signal at the input end through the first matching circuit, and the radio frequency amplifier circuit further comprises:

a second matching circuit, coupled to the output end of the amplifier, and configured to provide the output impedance matching the two fundamental tones, and on the radio frequency path, the amplifier transmits the amplified radio frequency signal at the output end through the second matching circuit.

3. The radio frequency amplifier circuit according to claim 2, further comprising:

a second inductance-capacitance resonance circuit, coupled to the output end of the amplifier, connected to the radio frequency path, and comprising a second resonance frequency, wherein the second inductance-capacitance resonance circuit provides a second filtering path, the second filtering path filters the signal component outside the frequency band formed by the first frequency and the second frequency in the amplified radio frequency signal, and the second inductance-capacitance resonance circuit provides a second bias voltage at the output end of the amplifier.

4. The radio frequency amplifier circuit according to claim 1, wherein the first inductance-capacitance resonance circuit further comprises:

a first capacitor, wherein a first end of the first capacitor is coupled to a reference voltage end; and the first inductor, wherein a first end of the first inductor is coupled to a second end of the first capacitor, and a second end of the first inductor is coupled to the first matching circuit.

5. The radio frequency amplifier circuit according to claim 4, wherein the first matching circuit comprises:

a second capacitor, coupled between an input end of the first matching circuit and the first inductance-capacitance resonance circuit; and a second inductor, coupled between the first inductance-capacitance resonance circuit and the input end of the amplifier.

6. The radio frequency amplifier circuit according to claim 5, wherein the first matching circuit further comprises:

a third capacitor, coupled between the reference voltage end and a common node between the second capacitor and the second inductor.

7. The radio frequency amplifier circuit according to claim 4, wherein the first capacitor is a variable capacitor.

8. The radio frequency amplifier circuit according to claim 5, wherein the first inductance-capacitance resonance circuit further comprises:

a first resistor, coupled between the first capacitor and the first inductor.

9. The radio frequency amplifier circuit according to claim 5, wherein the first matching circuit further comprises:

a second resistor, connected in parallel to the second capacitor between the input end of the first matching circuit and the first inductance-capacitance resonance circuit.

10. The radio frequency amplifier circuit according to claim 9, wherein the first capacitor is a variable capacitor.

11. The radio frequency amplifier circuit according to claim 4, wherein the first inductance-capacitance resonance circuit further comprises:

a fourth capacitor; and a third inductor, connected in series to the fourth capacitor between the second end of the first inductor and the reference voltage end.

12. The radio frequency amplifier circuit according to claim 3, wherein the second inductance-capacitance resonance circuit comprises:

a fifth capacitor; and a fourth inductor, coupled to the fifth capacitor between the output end of the amplifier and a reference voltage end, wherein a common node between the fifth capacitor and the fourth inductor is coupled to a power voltage to provide the second bias voltage at the output end of the amplifier.

13. A radio frequency amplifier circuit, comprising:

an amplifier, comprising an input end configured to receive a first bias voltage, and an output end;

a first matching circuit, coupled to the input end or the output end of the amplifier, wherein on a radio frequency path, the amplifier receives a radio frequency signal at the input end through the first matching circuit to amplify the radio frequency signal, or the amplifier transmits an amplified radio frequency signal at the output end through the first matching circuit; and a first inductance-capacitance resonance circuit, coupled to the first matching circuit and connected to the radio frequency path, wherein the first inductance-capacitance resonance circuit comprises a first inductor, and the first inductance-capacitance resonance circuit and the first matching circuit share an inductor comprised in the first matching circuit to obtain a first resonance frequency, wherein the radio frequency signal comprises two fundamental tones at a first frequency and a second frequency, the first matching circuit provides an input impedance or an output impedance matching the two fundamental tones, the first inductance-capacitance resonance circuit provides a first filtering path, and the first filtering path filters a signal component outside a frequency band formed by the first frequency and the second frequency in the radio frequency signal, wherein the first matching circuit is coupled to the output end of the amplifier, and configured to provide the output impedance matching the two fundamental tones, on the radio frequency path, the amplifier transmits the amplified radio frequency signal at the output end through the first matching circuit, and the first inductance-capacitance resonance circuit provides a second bias voltage at the output end of the amplifier.

14. A radio frequency amplifier circuit, comprising:
an amplifier, comprising an input end configured to receive a first bias voltage, and an output end;
a first matching circuit, coupled to the input end or the output end of the amplifier, wherein on a radio frequency path, the amplifier receives a radio frequency signal at the input end through the first matching circuit to amplify the radio frequency signal, or the amplifier transmits an amplified radio frequency signal at the output end through the first matching circuit; and
a first inductance-capacitance resonance circuit, coupled to the first matching circuit and connected to the radio frequency path, wherein the first inductance-capacitance resonance circuit comprises a first inductor, and the first inductance-capacitance resonance circuit and the first matching circuit share an inductor comprised in the first matching circuit to obtain a first resonance frequency,
wherein the radio frequency signal comprises two fundamental tones at a first frequency and a second frequency, the first matching circuit provides an input impedance or an output impedance matching the two fundamental tones, the first inductance-capacitance resonance circuit provides a first filtering path, and the first filtering path filters a signal component outside a frequency band formed by the first frequency and the second frequency in the radio frequency signal,
wherein the first inductance-capacitance resonance circuit further comprises a first switch coupled to the first matching circuit and connected to the radio frequency path.

15. The radio frequency amplifier circuit according to claim 1, wherein the radio frequency amplifier circuit comprises a plurality of stages of amplifiers connected in series, and the amplifier is a first-stage amplifier or a last-stage of amplifier of the plurality of stages of amplifiers.

16. The radio frequency amplifier circuit according to claim 3, wherein the second matching circuit comprises:
a sixth capacitor;
a fifth inductor, connected in series to the sixth capacitor between the output end of the amplifier and an output end of the second matching circuit; and
a seventh capacitor, coupled between a reference voltage end and a common node between the sixth capacitor and the fifth inductor.

17. The radio frequency amplifier circuit according to claim 16, wherein the second inductance-capacitance resonance circuit is coupled to the second matching circuit, and the second inductance-capacitance resonance circuit comprises:
a sixth inductor; and
an eighth capacitor, connected in series to the sixth inductor between the reference voltage end and the common node between the sixth capacitor and the fifth inductor, wherein a common node between the sixth inductor and the eighth capacitor is coupled to a power voltage to provide a third bias voltage at the common node between the sixth capacitor and the fifth inductor.

18. The radio frequency amplifier circuit according to claim 1, wherein the amplifier comprises:
a first transistor, wherein a control end of the first transistor is coupled to the first matching circuit, a first end of the first transistor is coupled to a second matching circuit, and a second end of the first transistor is coupled to a reference voltage end.

19. The radio frequency amplifier circuit according to claim 1, further comprising:
a bias circuit, coupled to the input end of the amplifier to provide the first bias voltage.

20. The radio frequency amplifier circuit according to claim 19, wherein the bias circuit comprises:
a second transistor, wherein a second end of the second transistor is coupled to a control end of a first transistor, and a first end of the second transistor is coupled to a power voltage end;
a third resistor, coupled between a control end of the second transistor and a reference bias end;
a diode circuit, coupled between the control end of the second transistor and the reference voltage end; and
a ninth capacitor, coupled between the control end of the second transistor and the reference voltage end.

* * * * *